(12) United States Patent
Chang et al.

(10) Patent No.: US 8,604,877 B2
(45) Date of Patent: Dec. 10, 2013

(54) DIFFERENTIAL AMPLIFIER

(75) Inventors: Charles Chang, Hsinchu County (TW); Ronald Chang, Hsinchu County (TW)

(73) Assignee: Hanerfy Technologies, Inc., Hsinchu County (TW)

( * ) Notice: Subject to any disclaimer, the term of this patent is extended or adjusted under 35 U.S.C. 154(b) by 33 days.

(21) Appl. No.: 13/331,558

(22) Filed: Dec. 20, 2011

(65) Prior Publication Data
US 2012/0161869 A1    Jun. 28, 2012

(30) Foreign Application Priority Data

Dec. 24, 2010    (TW) ................................ 99145951 A

(51) Int. Cl.
*H03F 3/45*    (2006.01)
(52) U.S. Cl.
USPC .......................................... 330/253; 330/260

(58) Field of Classification Search
USPC .................................................. 330/252–261
See application file for complete search history.

(56) References Cited

U.S. PATENT DOCUMENTS 8,294,517 B2 * 10/2012 Harada .......................... 330/261

* cited by examiner

*Primary Examiner* — Hieu Nguyen
(74) *Attorney, Agent, or Firm* — The PL Law Group, PLLC

(57) ABSTRACT

A differential amplifier is provided in the present invention. The differential amplifier includes an amplifying module having a resistive ratio, receiving an input voltage, and amplifying the input voltage as an output voltage in accordance with the resistive ratio; and a feedback module coupled with the amplifying module and generating a feedback signal in accordance with the input voltage and the output voltage for regulating the output voltage.

15 Claims, 3 Drawing Sheets

DIFFERENTIAL AMPLIFIER

FIELD OF THE INVENTION

The present invention relates to a differential amplifier, in particular to a fully differential amplifier.

BACKGROUND OF THE INVENTION

As a critical circuit unit in an analogy system and a mixing signal system, the operational amplifier is widely adopted in an analogy/digital converter (ADC), a souring filter, a waveform generator and a video frequency amplifier etc. In accomplice with the development of the CMOS technology, the dimension for the voltage source and the transistor channel is continuously miniaturized, so that the design for the operational amplifier becomes more and more complicated.

In an ADC, the operational amplifier is the most critical component. For example, certain un-ideal characteristics such as, finite gain, finite bandwidth and finite slew rate for the operational amplifier will cause incomplete charges shift in the integrator in the ADC and results in the nonlinearity effect for the ADC.

Thus there is a differential amplifier presented. The differential amplifier is an electronic amplifier which amplifies the voltage difference from two input ends by a stationary gain. The differential amplifier can not only effectively amplify direct current signal but can also effectively reduce zero drifting resulted from the power fluctuation and the temperature variation, and therefore it is in widespread use nowadays. In particular, the differential amplifier is massively adopted in the integrated operational circuit. The differential amplifier is often used as a pre-stage amplifier in a multi-stage amplifier, as an input level in a power amplifier and an emitter coupled logic (ECL) circuit. The differential amplifier possesses several advantages as follows: (1) It has high input resistance and low output resistance; (2) the output signal is in proportion to the difference of two input signals; and (3) the frequency respond is much broader than that in normal amplifier. A typical differential amplifier is a special direct coupled amplifier circuit, which requires an asymmetric layout which the electronic elements therein is arranged in asymmetric.

As compared with the single-ended operational amplifier, the conventional fully differential amplifier 10 usually used for transforming a single end signal into a differential signal as shown in FIG. 1 including a regular operational amplifier 11 further has many advantages such as the fully differential amplifier can provide larger output voltage swinging, is not easy to be influenced by noises resulted from the common mode, has better linearity, reduces even harmonics interferences and can simply the implementation of a basing circuit. However, although the fully differential amplifier 10 as shown in FIG. 1 has the aforementioned advantages, it is not widely applied, due to the lower bandwidth characteristic the fully differential amplifier has which requires to be incorporated with a common mode feedback (CMFB) circuit 12.

A conventional transistor-based amplifier as shown in FIG. 2 is a simple alternative scheme that uses transistors in replace of the operational amplifier to build a differential amplifier. The transistor-based differential amplifier is not such sensitive to be affected by the voltage difference between gate and source of the transistor and has a gain ratio $$G \cong \frac{R_{22}}{R_{21} + \frac{1}{Gm}},$$

where the Gm is a transconductance for an input end PMOS and has significant influence on gain ratio. Since the transconductance Gm is not a constant and varied in accordance with the manufacturing process, if it is desired to eliminate or minimize the influence of transconductance Gm upon the gain ratio, the resistance $R_{21}$ should be much larger than $$\frac{1}{Gm}$$

to render $$R_{21} \gg \frac{1}{Gm}.$$

If the transconductance Gm fails to be significantly raised, it must choose a resistor having a larger resistance $R_{21}$. However, the resistor with larger resistance $R_{21}$ will limit the amplifying performance for a transistor-based differential amplifier.

As could be known from FIG. 2, if the resistance $R_{21}$ is increased by a multiple K over resistance $R_{22}$, it is known that the influence of transconductance Gm upon the gain ratio will correspondingly become minor. In FIG. 2, the multiple K value is set as 2. However, in order to render the output signals Vin and Vip maintained on the same operating point and within a specific dynamic operating range, the electrical current flowing through the resistor $2*R_{21}$ must be reduced to $$\frac{1}{K}$$

times, and the total electrical current decrease quantity $$\left(1 - \frac{1}{K}\right)I$$

may be added to Vin and Vip or compensated by Vin and Vip. FIG. 3 is a diagram illustrating a conventional transistor-based differential amplifier whose multiple K value is set as 4.

Therefore, it is tried to rectify those drawbacks and provide a better differential amplifier. The present invention provides a differential amplifier in order to achieve the foresaid objective.

SUMMARY OF THE INVENTION

In order to overcome the shortcomings from prior art, the present invention provides a driving method and a corresponding driving circuit for LED, which can achieve high speed LED excitement and provide a design criterion for similar circuits. The present invention brings tremendous benefits for LED and LED relevant device.

The present invention proposes a transistor-based fully differential amplifier possessing a variable gain function applicable and suitable being disposed in a high speed signal processing amplifier. By largely increasing the equivalent transconductance Gm for the input end MOSs, the proposed differential amplifier can easily amplify the input signals with hundreds and even thousands times by simply adjusting the resistive ratio. The equivalent transconductance Gm for the input end MOSs is increased by adding a feedback circuit module including NMOS transistor and electrical current source into the differential amplifier circuit, so as to significantly reduce the influence that the drifting characteristic of semiconductor component acts on the gain ratio to an amplifier circuit.

In accordance with one aspect of the present invention, a differential amplifier is provided. The differential amplifier includes an amplifying module having a resistive ratio, receiving an input voltage, and amplifying the input voltage as an output voltage in accordance with the resistive ratio; and a feedback module coupled with the amplifying module and generating a feedback signal in accordance with the input voltage and the output voltage for regulating the output voltage.

In accordance with the second aspect of the present invention, a method of controlling a differential amplifier is provided. The method of controlling a differential amplifier, wherein the differential amplifier has a resistive ratio and comprises a PMOS having a transconductance value and coupled with an NMOS, comprising receiving an input voltage and amplifying the input voltage as an output voltage in accordance with the resistive ratio; and varying the transconductance value in accordance with the output voltage and the input voltage.

In accordance with the third aspect of the present invention, a differential amplifier is provided. The differential amplifier includes an amplifying module amplifying the input voltage as an output voltage; and a feedback module coupled with the amplifying module and adjusting the output voltage in accordance with the input voltage and the output voltage.

In accordance with the fourth aspect of the present invention, a method of controlling a differential amplifier is provided. The method of controlling a differential amplifier includes generating an output signal in response to an input signal; generating a feedback signal in accordance with the input signal and the output signal; and altering the output signal in accordance with the feedback signal.

Other objects, advantages and efficacy of the present invention will be described in detail below taken from the preferred embodiments with reference to the accompanying drawings, in which:

DETAILED DESCRIPTION OF THE PREFERRED EMBODIMENT

The present invention will now be described more specifically to the following embodiments. However, it is to be noted that the following descriptions of preferred embodiments of this invention are presented herein for the purposes of illustration and description only; it is not intended to be exhaustive or to be limited to the precise form disclosed.

Figure 1:
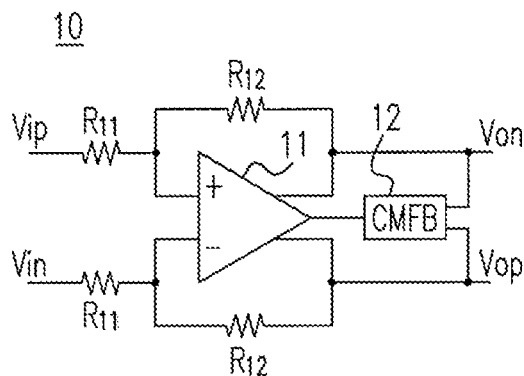
FIG. 1 is a schematic diagram illustrating a conventional fully differential amplifier.
Figure 2:
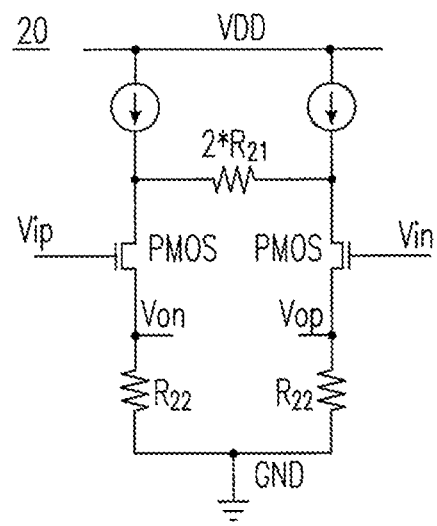
FIGS. 2 and 3 are schematic diagrams illustrating a conventional transistor-based amplifier.
Figure 3:
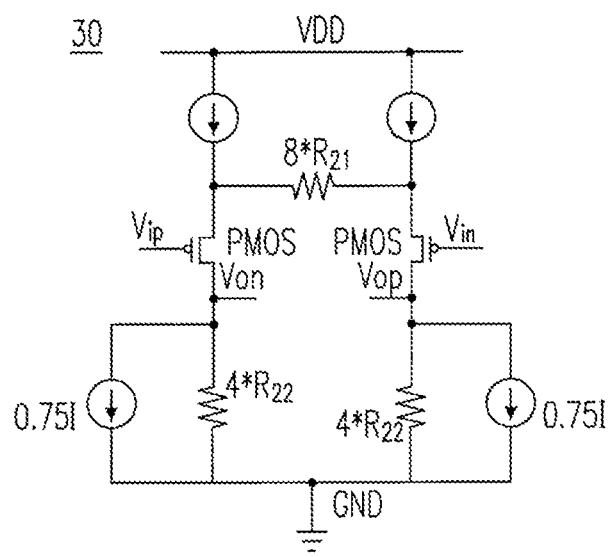
Figure 4:
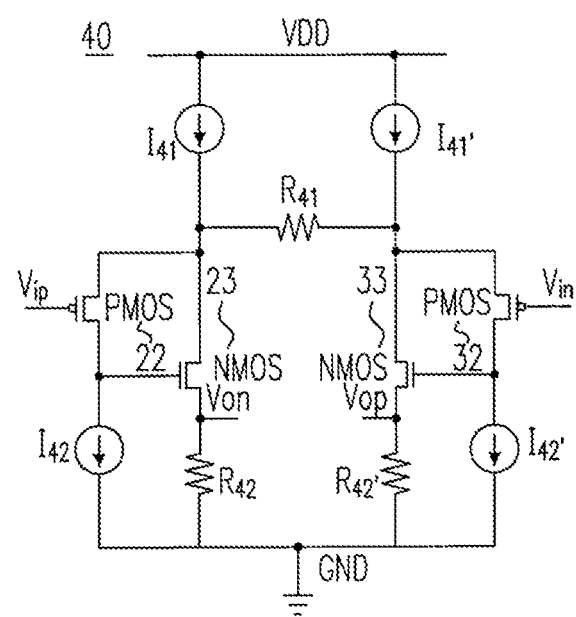
FIG. 4 is a schematic diagram illustrating a high speed fully differential amplifier in accordance with the present invention.

Please refer to FIG. 4, which is diagram illustrating a high speed fully differential amplifier in accordance with the present invention. The differential amplifier 40 as shown in FIG. 4 is preferably a variable gain amplifier includes an amplifying module and a feedback module, wherein the amplifying module further includes a first amplifying module and a second amplifying module, and the feedback module further includes a first feedback module and a second feedback module.

The first amplifying module includes a first PMOS 22, a first resistor R41, a third resistor R42', a first NMOS and a first current source I41 and the first feedback module includes a second NMOS 23, a second resistor R42 and a second current source I42. The second amplifying module includes a second PMOS 32, the first resistor R41, a second resistor R42, a second NMOS 23 and a third current source I41' and the second feedback module includes a first NMOS 33, a third resistor R42' and a fourth current source I42'. The second current source I42 and the fourth current source I42' have the same characteristic. It is noted that the first PMOS 22 and the second PMOS 32 used in the first amplifying module and the second amplifying module can be replaced by the NMOS.

The first resistor 41 having a first end and a second end, the first PMOS 22 having a first gate, a first source and a first drain, the first NMOS 33 having a second gate, a second source and a second drain, the second PMOS 32 having a third gate, a third source and a third drain, and the second NMOS 23 having a fourth gate, a fourth source and a fourth drain, wherein the first source is coupled with the first end of the first resistor R41, the first gate receives a first input signal Vip, the first drain is coupled with the second gate of the second NMOS 23 and a second current source I42, the second drain is coupled with the third drain of the second PMOS 32 and the second end of the first resistor R41, the second source is coupled with the third resistor R42' and outputs a first output signal Vip, the third source is coupled with the second end of the first resistor R41, the third gate receives a second input signal Vin, the third drain is coupled with the second gate of the first NMOS 33 and a fourth current source I42', and the fourth drain is coupled with the first source of the PMOS 22 and the first end of the first resistor R41, the fourth source is coupled with the second resistor R42 and outputs a second output signal Vin.

The first and second feedback modules included in the differential amplifier 40 can increase the equivalent transconductance Gin for the first PMOS 22 and the second PMOS 32, so that the influence of equivalent transconductance Gm on the gain ratio is accordingly minimized, which causes the gain ratio almost approaching to the resistive ratio $$\frac{R_{42}}{R_{41}}.$$

It is noted that the first PMOS 22 and the second PMOS 32 can be replaced by the NMOS.

Typically although due to its relatively larger swinging, the PMOS has a relatively small transconductance Gm value as compared with the NMOS, but the PMOS is relatively cheaper than that of the NMOS and can be fabricated relatively simply, the PMOS-based technology remains being utilized in some middle-scale and small-scale digital control circuit.

The above-mentioned feedback module including the NMOS and the current source is capable of increasing the overall transconductance Gm for input controlling end MOSs, for example, a PMOS or an NMOS, in the deferential amplifier circuit, so as to significantly reduce the influence that the drifting characteristic of semiconductor component, e.g.: an input end MOS, acts on the gain ratio to an amplifier circuit. The differential amplifier circuit configured with the feedback module has a gain ratio approximate to the theoretical value $$G \cong \frac{R_{42}}{R_{41}}.$$

Thus the differential amplifier can well and precisely amplify the input signal in accordance with the theoretical gain ratio.

There are more embodiments provides as follows.

Embodiment 1

A differential amplifier includes an amplifying module having a resistive ratio, receiving an input voltage, and amplifying the input voltage as an output voltage in accordance with the resistive ratio; and a feedback module coupled with the amplifying module and generating a feedback signal in accordance with the input voltage and the output voltage for regulating the output voltage.

Embodiment 2

The differential amplifier according to Embodiment 1 further includes a first resistor having a first end and a second end; a second resistor; a third resistor; a first PMOS having a first gate, a first source and a first drain; a first NMOS having a second gate, a second source and a second drain; a second PMOS having a third gate, a third source and a third drain; and a second NMOS having a fourth gate, a fourth source and a fourth drain, wherein the first source is coupled with the first end, the first gate receives a first input signal, the first drain is coupled with the second gate and a second current source, the second drain is coupled with the third drain and the second end, the second source is coupled with the third resistor and outputs a first output signal, the third source is coupled with the second end, the third gate receives a second input signal, the third drain is coupled with the second gate and a fourth current source, the fourth drain is coupled with the first source and the first end, and the fourth source is coupled with the second resistor and outputs a second output signal.

Embodiment 3

The differential amplifier according to Embodiment 2, wherein the amplifying module comprises a first amplifying module and a second amplifying module.

Embodiment 4

The differential amplifier according to Embodiment 3, wherein the first amplifying module comprises the first PMOS, the first resistor, the third resistor and the first NMOS.

Embodiment 5

The differential amplifier according to Embodiment 3, wherein the second amplifying module comprises the second PMOS, the first resistor, the second resistor and the second NMOS.

Embodiment 6

The differential amplifier according to Embodiment 2, wherein the feedback module comprises a first feedback module and a second feedback module.

Embodiment 7

The differential amplifier according to Embodiment 6, wherein the first feedback module comprises the first NMOS, the third resistor and the fourth current source.

Embodiment 8

The differential amplifier according to Embodiment 6, wherein the second feedback module comprises the second NMOS, the second resistor and the second current source.

Embodiment 9

The differential amplifier according to Embodiment 2, wherein the first output signal and the second output signal are both maintained on an operating point within a dynamic operating range.

Embodiment 10

The differential amplifier according to Embodiment 9, wherein the dynamic operating range is a workable range within which the differential amplifier is capable of accepting an input signal and generating an output signal.

Embodiment 11

The differential amplifier according to Embodiment 2, wherein a ratio of a first resistance of one of the second resistor and the third resistor over a second resistance of the first resistor is defined as an amplifying factor.

Embodiment 12

The differential amplifier according to Embodiment 11, wherein the amplifying factor is linearly varied between the operating point and the respective boundary values of the dynamic operating range.

Embodiment 13

The differential amplifier according to Embodiment 1, wherein the feedback signal is presented as a negative voltage level.

Embodiment 14

A method of controlling a differential amplifier, wherein the differential amplifier has a resistive ratio and comprises a PMOS having a transconductance value and coupled with an NMOS, comprising receiving an input voltage and amplifying the input voltage as an output voltage in accordance with the resistive ratio; and varying the transconductance value in accordance with the output voltage and the input voltage.

Embodiment 15

The method according to Embodiment 14, wherein the input voltage is received and amplified by the PMOS and the transconductance value is varied by the NMOS.

Embodiment 16

A differential amplifier includes an amplifying module amplifying the input voltage as an output voltage; and a feedback module coupled with the amplifying module and adjusting the output voltage in accordance with the input voltage and the output voltage.

Embodiment 17

A method of controlling a differential amplifier includes generating an output signal in response to an input signal; generating a feedback signal in accordance with the input signal and the output signal; and altering the output signal in accordance with the feedback signal.

Based on the above descriptions, while the invention has been described in terms of what are presently considered to be the most practical and preferred embodiments, it is to be understood that the invention should not be limited to the disclosed embodiment. On the contrary, it is intended to cap numerous modifications and variations included within the spirit and scope of the appended claims which are to be accorded with the broadest interpretation so as to encompass all such modifications and variations. Therefore, the above description and illustration should not be taken as limiting the scope of the present invention which is defined by the appended claims.

What is claimed is:

1. A differential amplifier, comprising:
   n amplifying module having a resistive ratio, receiving an input voltage, and amplifying the input voltage as an output voltage in accordance with the resistive ratio;
   a first resistor having a first end and a second end;
   a second resistor;
   a third resistor;
   a first PMOS having a first gate, a first source and a first drain;
   a first NMOS having a second gate, a second source and a second drain;
   a second PMOS having a third gate, a third source and a third drain; and
   a second NMOS having a fourth gate, a fourth source and a fourth drain,
   wherein the first source is coupled with the first end, the second drain and a first current source, the first gate receives a first input signal, the first drain is coupled with the second gate and a second current source, the second source is coupled with the third resistor and outputs a first output signal, the third source is coupled with the second end, the fourth drain and a third current source, the third gate receives a second input signal, the third drain is coupled with the fourth gate and a fourth current source, the fourth source is coupled with the second resistor and outputs a second output signal, the input voltage comprises the first input signal and the second input signal, and the output voltage comprises the first output signal and the second output signal.

2. The differential amplifier according to claim 1, wherein the amplifying module comprises a first amplifying module and a second amplifying module.

3. The differential amplifier according to claim 2, wherein the first amplifying module comprises the first PMOS, the first resistor, the third resistor and the first NMOS.

4. The differential amplifier according to claim 2, wherein the second amplifying module comprises the second PMOS, the first resistor, the second resistor and the second NMOS.

5. The differential amplifier according to claim 1, further comprising a feedback module having a first feedback module and a second feedback module.

6. The differential amplifier according to claim 5, wherein the first feedback module comprises the first NMOS, the third resistor and the second current source.

7. The differential amplifier according to claim 5, wherein the second feedback module comprises the second NMOS, the second resistor and the fourth current source.

8. The differential amplifier according to claim 1, wherein the first output signal and the second output signal are both maintained on an operating point within a dynamic operating range.

9. The differential amplifier according to claim 8, wherein the dynamic operating range is a workable range within which the differential amplifier is capable of accepting an input signal and generating an output signal.

10. The differential amplifier according to claim 1, wherein a ratio of a first resistance of one of the second resistor and the third resistor over a second resistance of the first resistor is defined as an amplifying factor.

11. The differential amplifier according to claim 10, wherein the amplifying factor is linearly varied between the operating point and the respective boundary values of the dynamic operating range.

12. A method of controlling a differential amplifier, wherein the differential amplifier has a resistive ratio, the method comprising:
    configuring the differential amplifier to comprise:
        a first resistor having a first end and a second end;
        a second resistor;
        a third resistor;
        a first PMOS having a first gate, a first source and a first drain;
        a first NMOS having a second gate, a second source and a second drain;
        a second PMOS having a third gate, a third source and a third drain; and
        a second NMOS having a fourth gate, a fourth source and a fourth drain,
        wherein the first source is coupled with the first end, the second drain and a first current source, the first gate receives a first input signal, the first drain is coupled with the second gate and a second current source, the second source is coupled with the third resistor and outputs a first output signal, the third source is coupled with the second end, the fourth drain and a third current source, the third gate receives a second input signal, the third drain is coupled with the fourth gate and a fourth current source, and the fourth source is coupled with the second resistor and outputs a second output signal;
    receiving an input voltage comprising the first input signal and the second input signal and amplifying the input voltage as an output voltage comprising the first output signal and the second output signal in accordance with the resistive ratio.

13. The method according to claim 12, wherein the input voltage is received and amplified by the PMOS and the transconductance value is varied by the NMOS.

14. A differential amplifier, comprising:
    n amplifying module amplifying the input voltage as an output voltage;
    a first resistor having a first end and a second end;
    a second resistor;
    a third resistor;

a first PMOS having a first gate, a first source and a first drain;
a first NMOS having a second gate, a second source and a second drain;
a second PMOS having a third gate, a third source and a third drain; and
a second NMOS having a fourth gate, a fourth source and a fourth drain,
wherein the first source is coupled with the first end, the second drain and a first current source, the first gate receives a first input signal, the first drain is coupled with the second gate and a second current source, the second source is coupled with the third resistor and outputs a first output signal, the third source is coupled with the second end, the fourth drain and a third current source, the third gate receives a second input signal, the third drain is coupled with the fourth gate and a fourth current source, the fourth source is coupled with the second resistor and outputs a second output signal, the input voltage comprises the first input signal and the second input signal, and the output voltage comprises the first output signal and the second output signal.

15. A method of controlling a differential amplifier, comprising:
configuring the differential amplifier to comprise:
a first resistor having a first end and a second end;
a second resistor;
a third resistor;
a first PMOS having a first gate, a first source and a first drain;
a first NMOS having a second gate, a second source and a second drain;
a second PMOS having a third gate, a third source and a third drain; and
a second NMOS having a fourth gate, a fourth source and a fourth drain,
wherein the first source is coupled with the first end, the second drain and a first current source, the first gate receives a first input signal, the first drain is coupled with the second gate and a second current source, the second source is coupled with the third resistor and outputs a first output signal, the third source is coupled with the second end, the fourth drain and a third current source, the third gate receives a second input signal, the third drain is coupled with the fourth gate and a fourth current source, and the fourth source is coupled with the second resistor and outputs a second output signal; and
generating an output signal comprising the first output signal and the second output signal in response to an input signal comprising the first input signal and the second input signal.

* * * * *